US010297422B2

(12) United States Patent
Sato

(10) Patent No.: US 10,297,422 B2
(45) Date of Patent: May 21, 2019

(54) SYSTEMS AND METHODS FOR CALIBRATING CONVERSION MODELS AND PERFORMING POSITION CONVERSIONS OF VARIABLE CAPACITORS IN MATCH NETWORKS OF PLASMA PROCESSING SYSTEMS

(71) Applicant: Lam Research Corporation, Fremont, CA (US)

(72) Inventor: Arthur H. Sato, San Jose, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 184 days.

(21) Appl. No.: 15/335,528

(22) Filed: Oct. 27, 2016

(65) Prior Publication Data

US 2017/0125218 A1    May 4, 2017

Related U.S. Application Data

(60) Provisional application No. 62/250,648, filed on Nov. 4, 2015.

(51) Int. Cl.
*H01J 37/32* (2006.01)

(52) U.S. Cl.
CPC .............. *H01J 37/32183* (2013.01)

(58) Field of Classification Search
CPC .................................. H01J 37/32183
See application file for complete search history.

(56) References Cited

U.S. PATENT DOCUMENTS

| | | | |
|---|---|---|---|
| 6,259,334 B1* | 7/2001 | Howald | H01J 37/32183 315/111.21 |
| 2003/0079983 A1* | 5/2003 | Long | H01J 37/32082 204/164 |
| 2003/0097984 A1* | 5/2003 | Nakano | H01J 37/32082 118/712 |
| 2010/0073104 A1* | 3/2010 | Cotter | H03H 7/40 333/17.3 |

* cited by examiner

*Primary Examiner* — Manuel L Barbee

(57) ABSTRACT

A control system is provided and includes a memory and a conversion module. The memory is configured to store position data of first positions of a first variable capacitor of a first match network of a first plasma processing system. Each of the first positions of the first variable capacitor corresponds to a respective one of multiple loads experienced by the first match network. The conversion module is configured to: obtain the position data stored in the memory; determine reference capacitor positions based on the position data; determine a calibrated conversion model based on the reference capacitor positions, where the calibrated conversion model converts second positions of the first variable capacitor to comparable capacitor positions, and where the second positions are positions of the first variable capacitor existing subsequent to the determination of the calibrated conversion model; and store the calibrated conversion model.

33 Claims, 11 Drawing Sheets

SYSTEMS AND METHODS FOR CALIBRATING CONVERSION MODELS AND PERFORMING POSITION CONVERSIONS OF VARIABLE CAPACITORS IN MATCH NETWORKS OF PLASMA PROCESSING SYSTEMS

CROSS-REFERENCE TO RELATED APPLICATIONS

This application claims the benefit of U.S. Provisional Application No. 62/250,648 filed Nov. 4, 2015. The entire disclosure of the application referenced above is incorporated herein by reference.

FIELD

The present disclosure relates to etching and deposition systems, and more particularly, to transformer coupled capacitive tuning systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During manufacturing of semiconductor devices, etch processes and deposition processes may be performed within a processing chamber. Ionized gas, or plasma, can be introduced into the plasma chamber to etch (or remove) material from a substrate such as a semiconductor wafer, and to sputter or deposit material onto the substrate. Creating plasma for use in manufacturing or fabrication processes typically begins by introducing process gases into the processing chamber. The substrate is disposed in the processing chamber on a substrate support such as an electrostatic chuck or a pedestal.

The processing chamber may include transformer coupled plasma (TCP) reactor coils. A radio frequency (RF) signal, generated by a power source, is supplied to the TCP reactor coils. A dielectric window, constructed of a material such as ceramic, is incorporated into an upper surface of the processing chamber. The dielectric window allows the RF signal to be transmitted from the TCP reactor coils into the interior of the processing chamber. The RF signal excites gas molecules within the processing chamber to generate inductively-coupled plasma.

The TCP reactor coils are driven by a transformer coupled capacitive tuning (TCCT) match network. The TCCT match network receives the RF signal supplied by the power source and enables tuning of power provided to the TCP reactor coils. The TCCT match network may include variable capacitors. Each of the variable capacitors includes a stationary electrode and a movable electrode. A capacitance of the corresponding capacitor is directly related to position of the movable electrode relative to the stationary electrode. The movable electrodes can be connected to a leadscrew, which can be driven by a rotary motor.

Power supplied to each of the TCP reactor coils is based on positions of the movable electrodes of the capacitors. A ratio of power delivered to the TCP coils is also based on the positions of the movable electrodes of the capacitors. One or more power ratios provided during etching can be different than one or more power ratios provided during deposition.

SUMMARY

A control system is provided and includes a memory and a conversion module. The memory is configured to store position data of first positions of a first variable capacitor of a first match network of a first plasma processing system. Each of the first positions of the first variable capacitor corresponds to a respective one of multiple loads experienced by the first match network. The conversion module is configured to: obtain the position data stored in the memory; determine reference capacitor positions based on the position data; determine a calibrated conversion model based on the reference capacitor positions, where the calibrated conversion model converts second positions of the first variable capacitor to comparable capacitor positions, and where the second positions are positions of the first variable capacitor existing subsequent to the determination of the calibrated conversion model; and store the calibrated conversion model.

In other features, a control system is provided and includes a memory and a conversion module. The memory is configured to store position data of first positions of a variable capacitor of a first power splitter of a first plasma processing system. Each of the first positions of the variable capacitor corresponds to a respective one of multiple loads experienced by the first power splitter. The conversion module is configured to: obtain the position data stored in the memory; determine reference capacitor positions based on the position data; determine a calibrated conversion model based on the reference capacitor positions, where the calibrated conversion model converts second positions of the variable capacitor to comparable capacitor positions, and where the second positions are positions of the variable capacitor existing subsequent to the determination of the calibrated conversion model; and store the calibrated conversion model.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
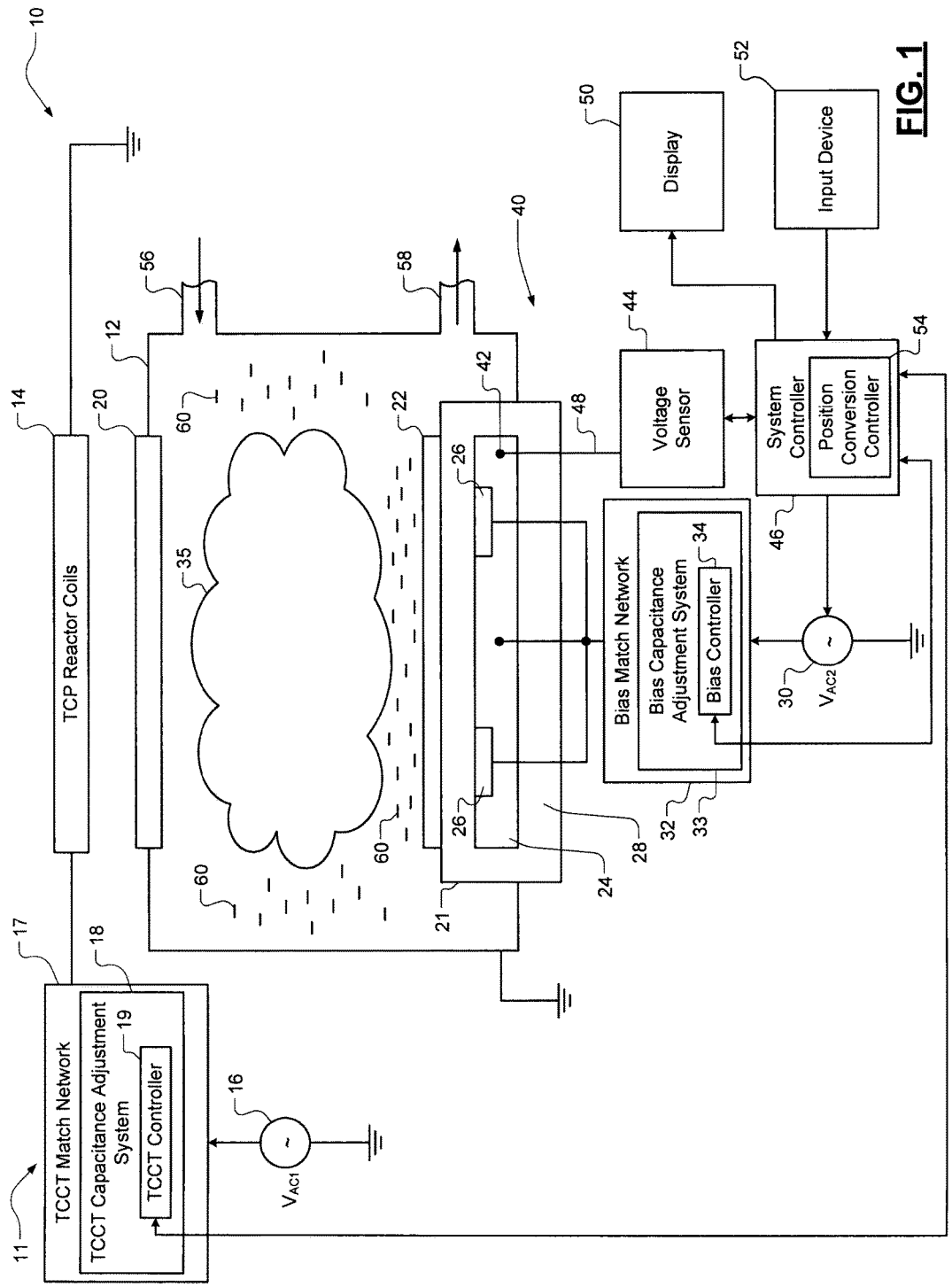
FIG. 1 is a functional block diagram of an example of a plasma processing system incorporating a position conversion controller in accordance with the present disclosure.

A traditional TCCT match network may include a radio frequency (RF) match network and a power splitter, which may include variable capacitors (e.g., vacuum variable capacitors). The variable capacitors of the power splitter correspond to TCP reactor coils of a processing chamber. Each of the variable capacitors may include stationary electrodes and movable electrodes. The TCP reactor coils may include an inner coil and an outer coil. The inner coil is disposed within an outer coil. A ratio of power supplied to the inner coil relative to power supplied to the outer coil is adjusted by moving the moveable electrodes of the capacitors relative to the stationary electrodes. The moveable electrodes may be moved via respective leadscrews and rotary motors.

A processing facility of a customer may have multiple processing chambers. Each processing chamber may have a respective TCCT match network. Manufacturing differences associated with components of RF match networks and power splitters in the TCCT match networks and manufacturing variations in the processing chambers can result in different capacitor positions and loads on the TCCT match networks. As an example, manufacturing differences of the capacitors may result in the same corresponding capacitors of different TCCT match networks having difference capacitances for a same position. Also, positions of the variable capacitors of the TCCT match networks can be adjusted to, for example, maximize power transfer through the RF match networks, minimize reflected power, and provide predetermined power ratios. As a result, set positions of the variable capacitors of the TCCT match networks of the same type can be different when operating according to a same recipe.

Differences in positions of the same corresponding capacitors of different TCCT match networks may be used by a customer as an indicator of an issue with one of the processing chambers and/or one of the TCCT match networks (referred to as an "outlier chamber" or an "outlier TCCT match network"). To determine if an issue exists, capacitor positions of the TCCT match networks may be compared for operation of the processing chambers according to a same recipe. If, for example, a position of a capacitor of a first RF match network for a first processing chamber is not the same or within a predetermined range of the positions of the same corresponding capacitors in the RF match networks of the other processing chambers, then an issue may exist with the first RF match network. The difference in positions may be used as an early indicator to predict that the first RF match network has degraded and/or needs to be fixed or replaced. As an example, a component of the first RF match network may have degraded, such that the first RF match network is more lossy than the other RF match networks. However, due to the manufacturing differences of the TCCT match networks and/or the processing chambers, differences in capacitor positions can provide a false alarm. An incorrect determination may be made that the first RF match network or a corresponding power splitter needs to be fixed or replaced. For example, the position of the capacitor of the first RF match network may be different due to the stated manufacturing differences and not due to component degradation. This difference may be large enough to cause a false alarm. False alarms can cause frequent removal and/or replacement of RF match networks, power splitters, and TCCT match networks.

A RF match network may include two or more inductor-capacitor branches, where each branch includes an inductor connected series with a capacitor. Each branch is characterized by three parameters; an inductance of the inductor, a capacitance of the capacitor, and a capacitance per count ratio $\alpha$. Positions of the capacitors may be referred to as a number of counts, where zero counts refers to a minimum capacitance position and a maximum amount of counts (e.g., 1000 counts) refers to a maximum capacitance position. For example, a capacitance $C(s)$ of a variable vacuum capacitor may be represented by equation 1, where $C_0$ is a base capacitance and s refers to the position of the variable vacuum capacitor.

$$C(s) = C_0 + \alpha s \tag{1}$$

The base capacitance may refer to a low end capacitance (e.g., a minimum capacitance or 0 pico-farads (pF)) or a high end capacitance (e.g., a maximum capacitance or 1500 pF). Variation in any of the three parameters of each of the branches causes the capacitor position s to be different from RF match network to RF match network, although the impedances of the same corresponding branch of the RF match networks are the same. As a result, false alarms can regularly occur because of the variations in the three parameters.

The examples set forth below include performing capacitor position conversions to minimize and prevent false alarms from occurring. The capacitor position conversions include converting actual capacitor positions for which corresponding comparisons may not be reliable, to comparable capacitor positions (referred to herein as "golden match positions") that minimize and/or prevent generation of false alarms. The conversion in effect minimizes and/or removes the variability in reported capacitor positions due to manufacturing differences. The reference and/or average capacitor positions are generated and mapped from corresponding actual capacitor positions to provide a calibrated conversion model. A calibrated conversion model may be generated during a calibration process of each variable capacitor of a match network. A calibrated conversion model is then used to convert the actual capacitor positions to comparable capacitor positions, which may then be used to evaluate performance of the match network.

FIG. 1 shows a plasma processing system 10 that includes a RF power ratio switching system 11, a plasma processing chamber 12, and TCP reactor coils 14. The RF power ratio switching system 11 switches RF power ratios of the TCP reactor coils 14. The TCP reactor coils 14 are disposed outside and above the plasma processing chamber 12. A first power source 16 provides a first RF source signal. The RF power ratio switching system 11 includes a TCCT (or first) match network 17. The TCCT match network 17 is included between the first power source 16 and the TCP reactor coils 14. The TCCT match network 17 enables tuning of power provided to the TCP reactor coils 14. The TCCT match network 17 includes a TCCT capacitance adjustment system 18, which includes a TCCT controller 19 that controls adjustment of positions and/or capacitances of variable capacitors included in the TCCT match network 17.

The plasma processing chamber 12 includes a dielectric window 20, which is located adjacent the TCP reactor coils 14 and allows efficient transmission of the first RF source signal into the plasma processing chamber 12 for plasma generation purposes. A substrate support 21 such as an electrostatic chuck, a pedestal or other suitable substrate support is disposed at the bottom of the plasma processing chamber 12. The substrate support 21 supports a substrate 22. If the substrate support 21 is an electrostatic chuck, the substrate support 21 includes electrically conductive portions 24 and 26, which are electrically isolated from each other. The substrate support 21 is surrounded by an insulator 28 and is capacitively coupled to the substrate 22. By applying a DC voltage across the conductive portions 24, 26, an electrostatic coupling is created between the conductive portions 24, 26 and the substrate 22. This electrostatic coupling attracts the substrate 22 against the substrate support 21.

The plasma processing system 10 further includes a bias RF power source 30, which is connected to a bias (or second) match network 32. The bias match network 32 is connected between the bias RF power source 30 and the substrate support 21. The bias match network 32 matches an impedance (e.g., 50Ω) of the bias RF power source 30 to an impedance of the substrate support 21 and plasma 35 in the plasma processing chamber 12 as seen by the bias matching network 32. The bias match network 32 includes a bias capacitance adjustment system 33, which includes a bias controller 34. The bias controller 34 controls adjustment of positions and/or capacitances of variable capacitors included in the bias match network 32.

Figure 3:
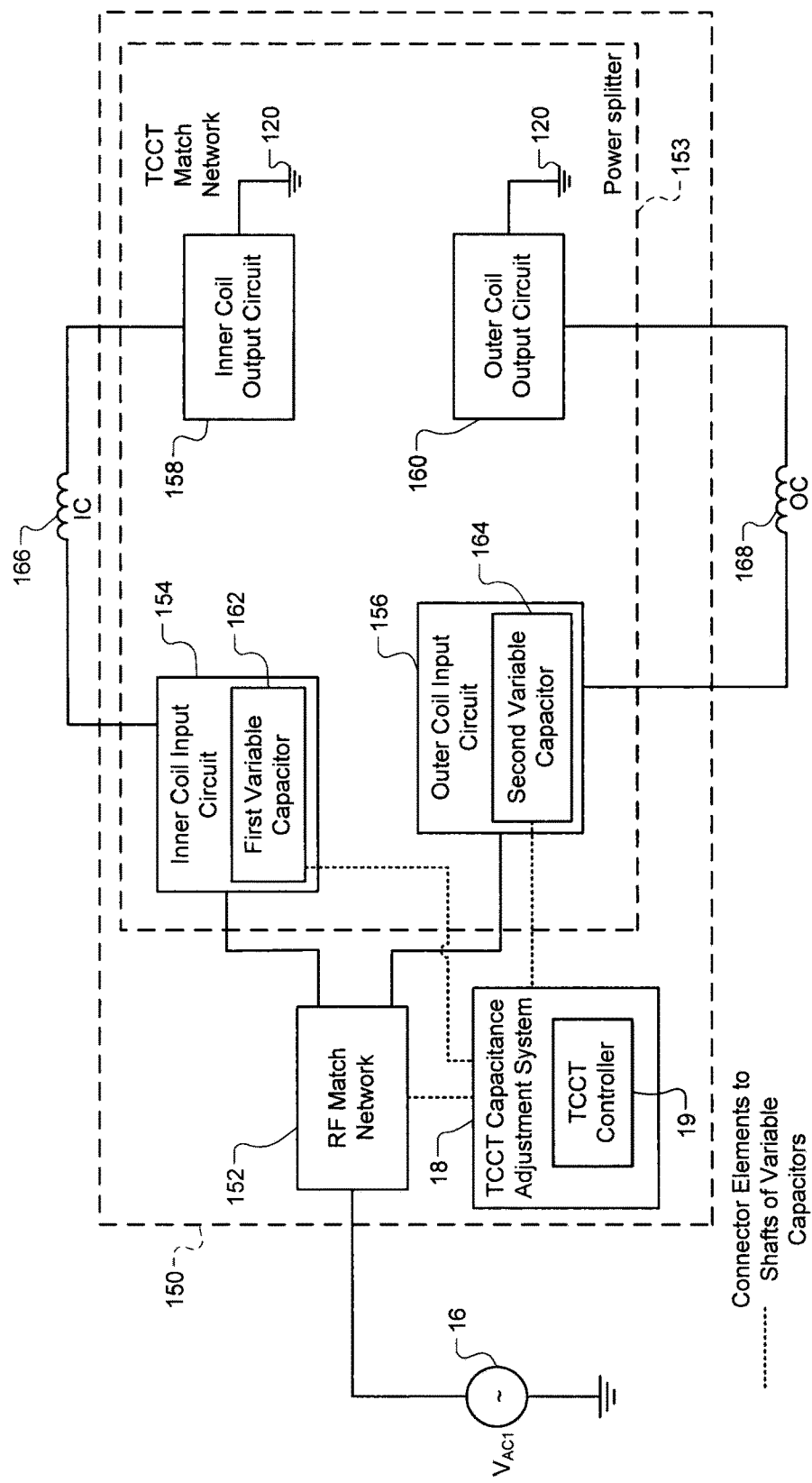
FIG. 3 is a functional block diagram of another example of a TCCT match network.
Figure 4:
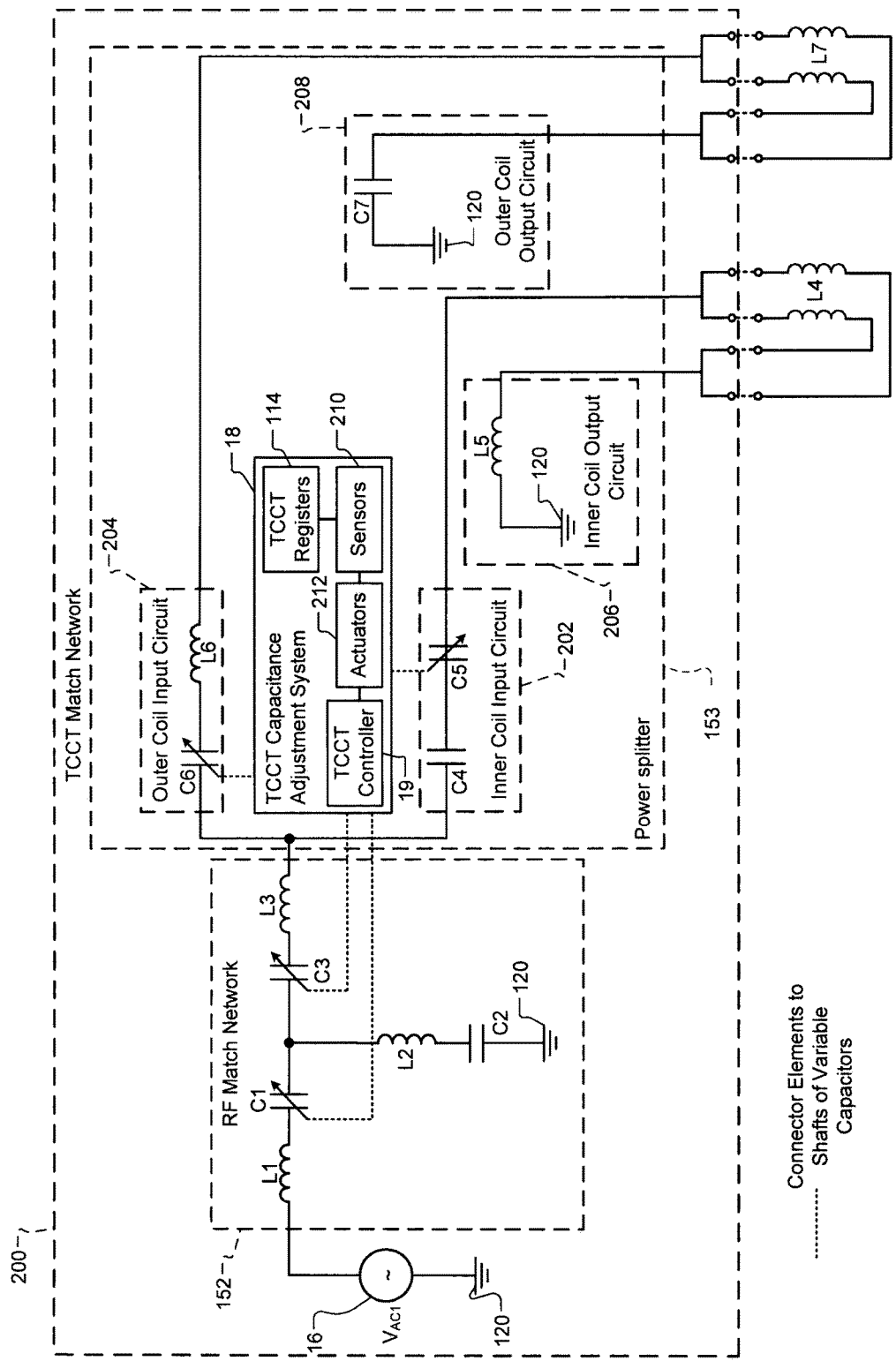
FIG. 4 is a schematic diagram of an example of the TCCT match network of FIG. 3 in accordance with the present disclosure.
Figure 5:
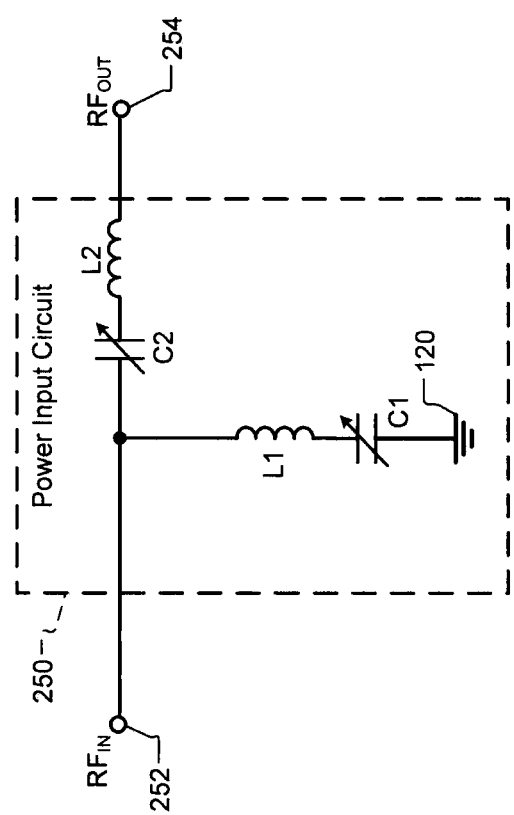
FIG. 5 is a schematic diagram of an example of a RF match network of a bias match network.

The capacitance adjustment systems 18, 33 may include actuators, such as motors, which are controlled by the controllers 19, 34. The actuators may be connected to shafts of the variable capacitors. The controllers 19, 34 adjust positions of the variable capacitors included in the TCCT match network 17 and in the bias match network 32 to adjust capacitances of the variable capacitors. The position adjustments of the variable capacitors in match networks 17, 32 adjust impedances of RF match networks included in the networks 17, 32. The position adjustments of the variable capacitors in the TCCT match network 17 adjust a RF power ratio of power supplied to the TCP reactor coils 14. Examples of the variable capacitors, the RF match networks, and other circuitry of the match networks 17, 32 are shown in FIGS. 3-5. Although the capacitance adjustment systems 18, 33 are shown as part of the match networks 17, 32, portions or all of the capacitance adjustment systems 18, 33 may be separate from the match networks 17, 32. The match networks 17, 32 may be implemented as stand-alone circuits and/or systems having respective housings with inputs and outputs.

The plasma processing system 10 further includes a voltage control interface (VCI) 40. The VCI 40 may include a pickup device 42, a voltage sensor 44, a system controller 46 and circuits between the voltage sensor 44 and the system controller 46. The pickup device 42 extends into the substrate support 21. This pickup device 42 is connected via a conductor 48 to the voltage sensor 44 and is used to generate a RF voltage signal.

Operation of the voltage sensor 44 may be monitored, manually controlled, and/or controlled via the system controller 46. The system controller 46 may display output voltages of the channels of the voltage sensor 44 on a display 50. Although shown separate from the system controller 46, the display 50 may be included in the system controller 46. A system operator may provide input signals via an input device 52 indicating (i) whether to switch between the channels, (ii) which one or more of the channels to activate, and/or (ii) which one or more of the channels to deactivate.

The system controller 46 includes a position conversion controller 54 that performs capacitor position conversions. This includes converting actual positions of the variable capacitors of the match networks 17, 32 to golden match positions. The golden match positions are then displayed on the display 50. The conversion process is further described below with respect to FIGS. 6-11. The system controller 46 may also compare positions of the same corresponding variable capacitors of multiple TCCT match networks and/or bias match networks of multiple processing systems and/or chambers. The system controller 46 may indicate via the display 50 the comparison results. The system controller 46 may also indicate, based on the comparison results, whether an issue exists with one of the match networks 17, 32 and/or RF impedance match networks and/or power splitters included in the match networks 17, 32.

In operation, a gas capable of ionization flows into the plasma processing chamber 12 through the gas inlet 56 and exits the plasma processing chamber 12 through the gas outlet 58. The first RF signal is generated by the RF power source 16 and is delivered to the TCP reactor coil 14. The first RF signal radiates from the TCP reactor coil 14 through the window 20 and into the plasma processing chamber 12. This causes the gas within the plasma processing chamber 12 to ionize and form the plasma 35. The plasma 35 produces a sheath 60 along walls of the plasma processing chamber 12. The plasma 35 includes electrons and positively charged ions. The electrons, being much lighter than the positively charged ions, tend to migrate more readily, generating DC bias voltages and DC sheath potentials at inner surfaces of the plasma processing chamber 12. An average DC bias voltage and a DC sheath potential at the substrate 22 affects the energy with which the positively charged ions strike the substrate 22. This energy affects processing characteristics such as rates at which etching or deposition occurs.

The system controller 46 may adjust the bias RF signal generated by the RF power source 30 to change the amount of DC bias and/or a DC sheath potential at the substrate 22. The system controller 46 may compare outputs of the channels of the voltage sensor 44 and/or a representative value derived based on the outputs of the channels to one or more set point values. The set point values may be predetermined and stored in a memory of the system controller 46. The bias RF signal may be adjusted based on differences between (i) the outputs of the voltage sensor 44 and/or the representative value and (ii) the one more set point values. The bias RF signal passes through the bias match network 32. An output provided by the bias match network 32 (referred to as a matched signal) is then passed to the substrate support 21. The bias RF signal is passed to the substrate 22 through the insulator 28.

Figure 2:
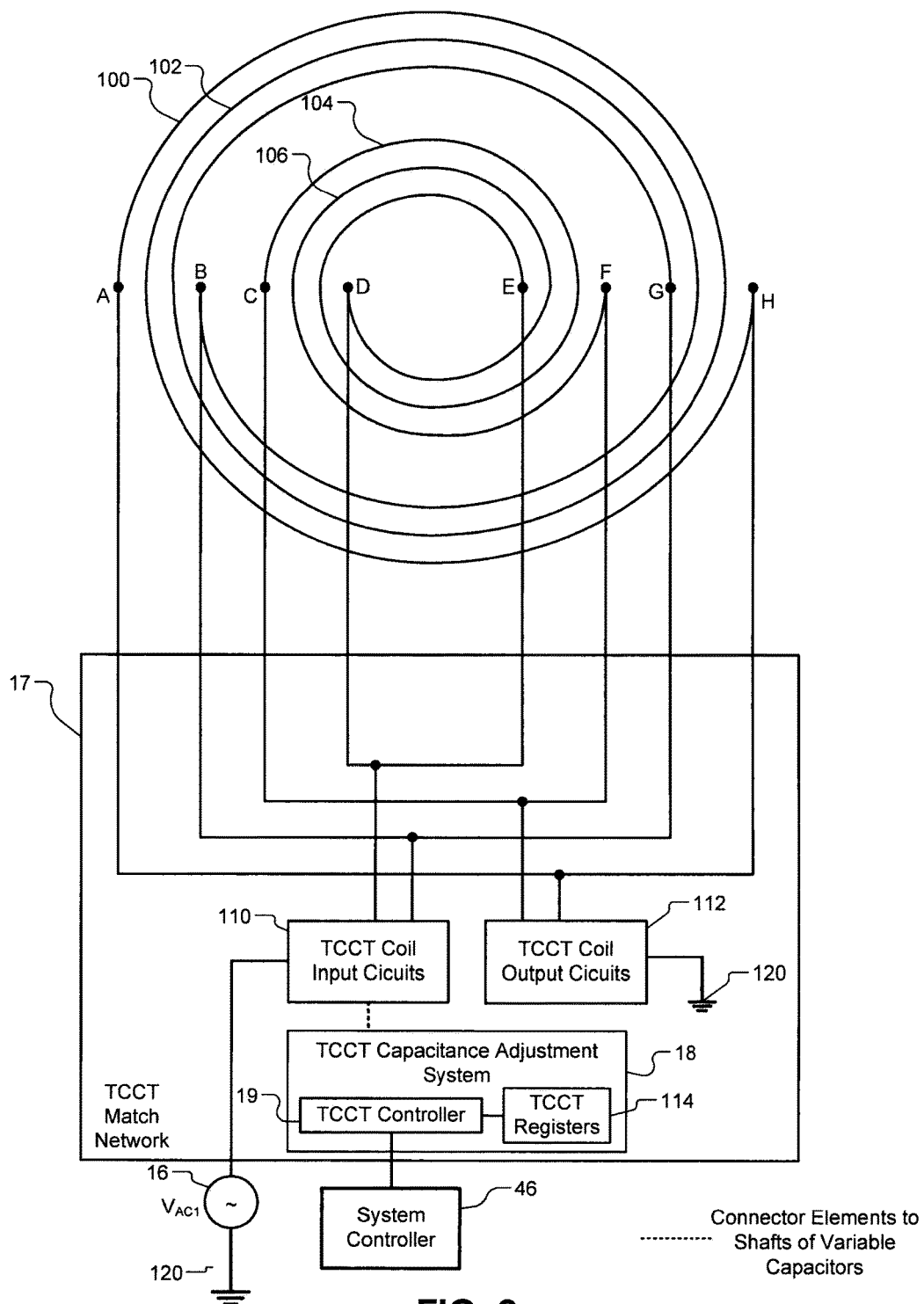
FIG. 2 is a schematic view of an example of a TCCT match network and a corresponding capacitance adjustment system in accordance with the present disclosure.

FIG. 2 shows an example of the TCCT match network 17 connected to examples TCP reactor coils 100, 102, 104, 106. The TCP reactor coils 100, 102 are collectively referred to as an outer coil. The TCP reactor coils 104, 106 are collectively referred to as an inner coil. The outer coil and inner coil may be spiral-shaped as shown or may have a different shape and/or configuration. The TCCT match network 17 includes TCCT coil input circuits 110 and TCCT coil output circuits 112. The TCCT coil input circuits 110 are connected to the inner coil at coil ends D and E and to the outer coil at coil ends B and G. The TCCT coil output circuits 112 are connected to the inner coil at coil ends C and F and to the outer coil at coil ends A and H. The TCCT coil input circuits 110 receive power from the power source 16, which is connected to a reference terminal (or ground reference) 120. The TCCT coil output circuits 112 are connected to the reference terminal 120.

The TCCT coil input circuits 110 include variable capacitors; examples of which are shown in FIGS. 3-5. Position adjustment of the variable capacitors adjusts power supplied from the TCCT coil input circuits 110 to the inner coil and the outer coil, respectively. This adjusts a RF power ratio between the inner coil and the outer coil. The TCCT capacitance adjustment system 18 is connected to the TCCT coil input circuits 110 and is controlled by the TCCT controller 19, which is connected to the system controller 46.

The TCCT capacitance adjustment system 18 may include registers 114 for storing positions of the variable capacitors of the TCCT match network 17. This may include storing actual (or raw) positions of the variable capacitors and/or storing reference capacitor positions, which may be received from the system controller 46 and/or the position conversion controller 54.

FIG. 3 shows a TCCT match network 150 that may replace the TCCT match network 17 of FIGS. 1-2. The TCCT match network 150 receives power from the power source 16. The TCCT match network 150 includes a RF match network 152, an inner coil input circuit 154, an outer coil input circuit 156, an inner coil output circuit 158, and an outer coil output circuit 160. The coil input circuits 154, 156 may include a first variable capacitor 162 and a second variable capacitor 164 and provide power to an inner coil IC 166 and an outer coil OC 168. Power out of the coils 166, 168 is provided to the coil output circuits 158, 160, which are connected to the reference terminal 120. The variable capacitors 162, 164 are adjusted by the TCCT controller 19 via, for examples, actuators of the TCCT capacitance adjustment system.

FIG. 4 shows a TCCT match network 200, which is an example of the TCCT match network 150 of FIG. 3. The TCCT match network 200 receives power from the power source 16. The TCCT match network 200 includes the RF match network 152, an inner coil input circuit 202, an outer coil input circuit 204, the inner coil output circuit 206, and the outer coil output circuit 208. The RF match network 152 may include three branches in a 'T'-type network configuration. The first branch includes a first capacitor C1 and a first inductor L1. The second branch includes a second capacitor C2 and a second inductor L2. The third branch includes a third capacitor C3 and a third inductor L3. As an example, the capacitors C1 and C3 may be variable capacitors and the inductors L1 and L2 may be parasitic inductances. The capacitors C1, C3 and inductors L1, L3 are connected in series between the power source 16 and the coil input circuits 202, 204. The capacitor C2 and inductor L2 are connected in series and between (i) an output of the capacitor C1 and an input of the capacitor C3, and (ii) the reference terminal 120.

The inner coil input circuit 202 may include capacitors C4, C5, where capacitor C5 is a variable capacitor. The capacitors C4 and C5 are connected in series between the inductor L3 and an inner coil L4. The inner coil output circuit 206 may include an inductor L5 that is connected between the inner coil L4 and the reference terminal 120. The outer coil input circuit 204 may include a capacitor C6 and an inductor L6 that are connected in series between the inductor L3 and an outer coil L7. The outer coil output circuit 208 may include a capacitor C7 that is connected between the outer coil L7 and the reference terminal 120.

The capacitors C1, C3, C5, C6 may be variable capacitors, which are adjusted by the capacitance adjustment system 18. The capacitive adjustment system 19 may receive signals from sensors 210 (e.g., potentiometers, encoders, etc.) for detecting positions of one or more shafts and/or rods of actuators 212 and the capacitors C1, C3, C5, C6. The sensors 210 may be included in the actuators 212, on the actuators 212, and/or connected directly and/or indirectly to the shafts and/or rods. The controller 46 of FIG. 1 may adjust voltage, current and/or power supplied to the actuators 212 to adjust position of the shafts and/or rods based on signals received from the sensors 210.

FIG. 5 shows a RF match network 250 that may be implemented in the bias match network 32 of FIG. 1. The RF match network 250 is in a 'L'-type configuration and includes two branches. The first branch includes a capacitor C1 and inductor L1. The second branch includes capacitor C2 and inductor L2. The first inductor L1 and the second capacitor C2 receive $RF_{IN}$ from, for example, the source 30 of FIG. 1 via an input terminal 252. The capacitor C1 and the inductor L1 are connected in series between the input terminal 252 and the reference terminal 120. The capacitor C2 and the inductor L2 are connected in series between the input terminal 252 and an output terminal 254. The capacitors C1, C2 may be variable capacitors adjusted by the bias capacitance adjustment system 33 of FIG. 1. The bias match network 32 of FIG. 1 may include actuators and sensors similar to the TCCT match network 17 for adjusting positions of the capacitors C1, C2.

Figure 6:
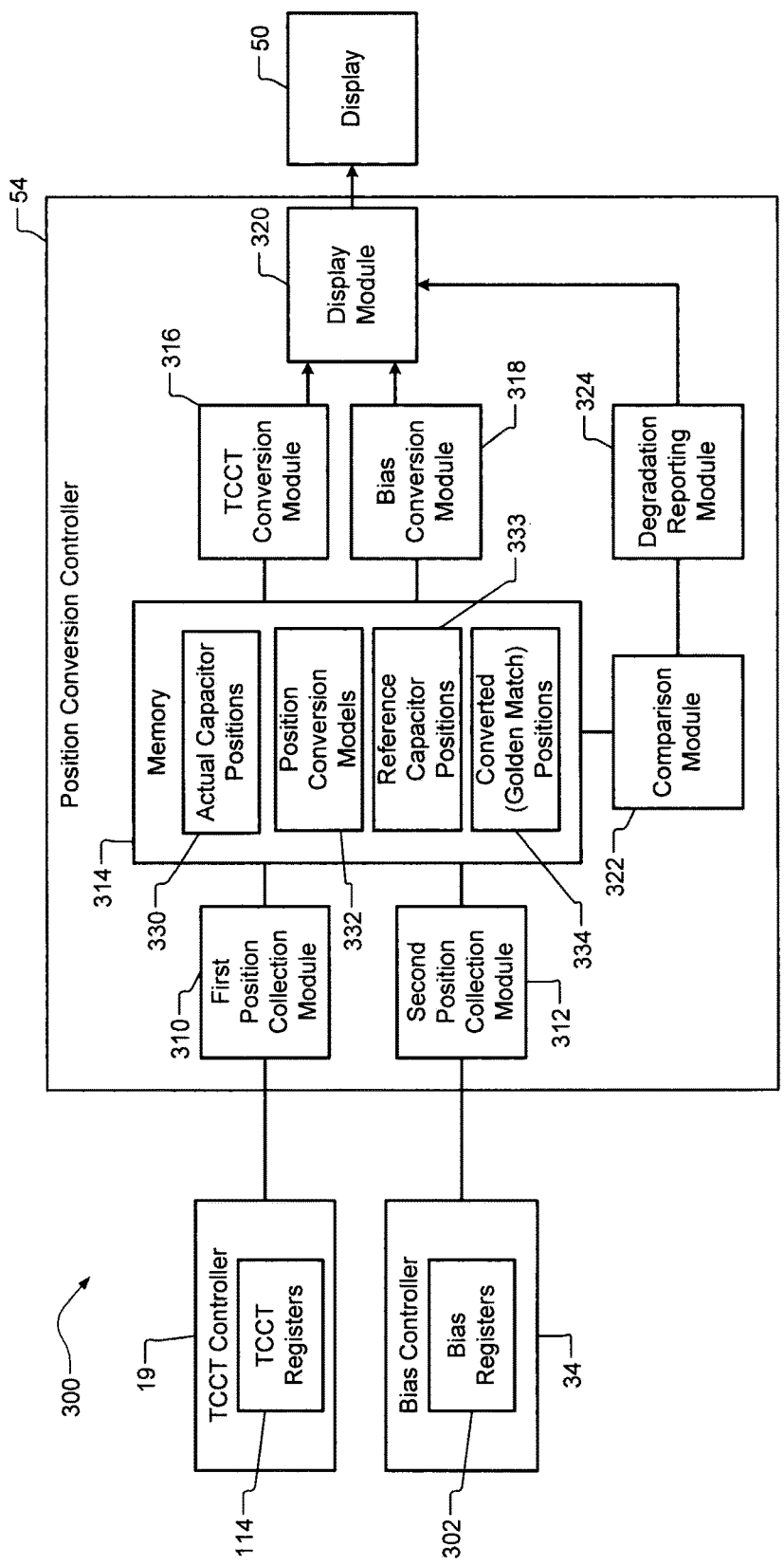
FIG. 6 is a functional block diagram of an example of a control system incorporating the position conversion controller in accordance with an embodiment of the present disclosure.

FIG. 6 shows a control system 300 incorporating the controllers 19, 34 and the position conversion controller 54 of FIG. 1. Although shown as separate controllers, the controllers 19, 34 and 54 may be implemented as a single controller and/or the controllers 19, 34 may be implemented as part of the controller 54. The TCCT controller 19 includes the TCCT registers 114. The bias controller 34 may include bias registers 302. The bias registers may store actual positions of variable capacitors (e.g., capacitors C1, C2 of FIG. 5) of the bias match network 32 and/or reference capacitor positions provided by the system controller 46 and/or the position conversion controller 54.

The position conversion controller 54 includes a first position collection module 310, a second position collection module 312, a memory 314, a TCCT conversion module 316, a bias conversion module 318, a display module 320, a comparison module 322 and a degradation reporting module 324. The modules 310, 312 may communicate with the controllers 19, 34 via a digital communication interface (e.g., a RS-232 interface, an Ethernet interface, an Ethernet for control automation technology (EtherCat) interface, or other suitable interface). The memory 314 stores actual detected and/or commanded capacitor positions 330, position conversion models 332, reference capacitor positions 333, and comparable capacitor (or golden match) positions 334. The memory 314 may also store results of (i) comparisons between capacitances and/or positions of variable capacitors of TCCT match networks, and/or (ii) comparisons between capacitances and/or positions of variable capacitors of bias match networks. The comparable capacitor positions 334, the comparison results, and/or issues determined based on an evaluation of the comparison results may be shown on the display 50.

Figure 7:
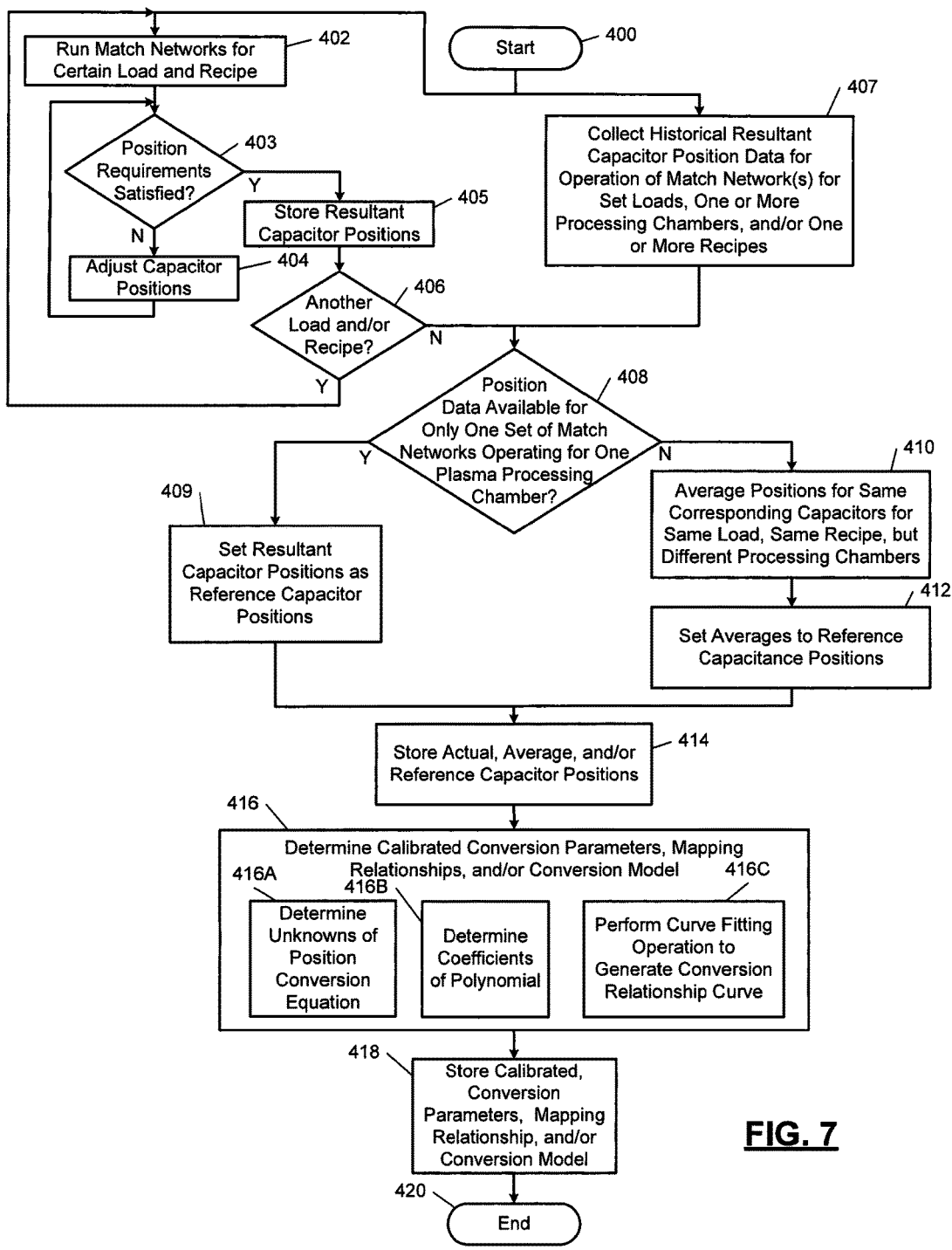
FIG. 7 illustrates a calibration method in accordance with an embodiment of the present disclosure.
Figure 11:
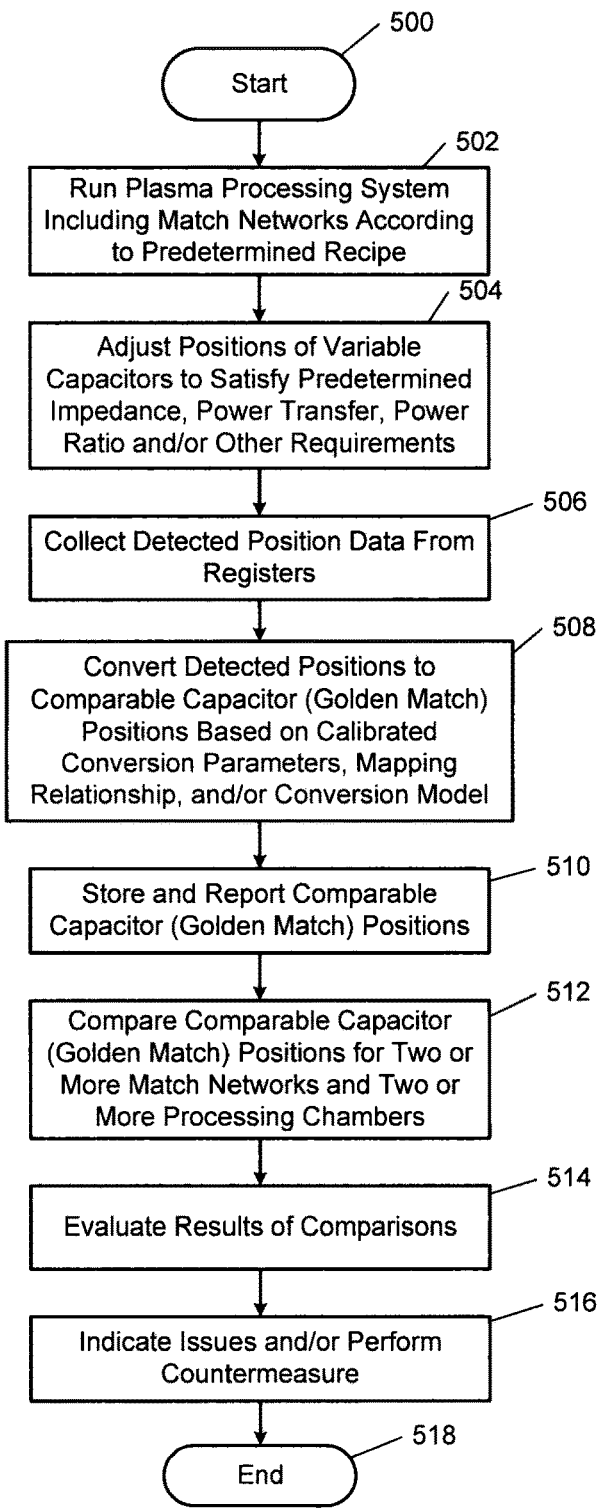
FIG. 11 illustrates a method of operating the control system of FIG. 6 and the plasma processing system of FIG. 1 in accordance with an embodiment of the present disclosure.

For further defined structure of the controllers and modules of FIGS. 1-4 and 6 see below provided methods of FIGS. 7 and 11 and below provided definitions for the term "controller" and "module". The systems disclosed herein may be operated using numerous methods, example methods are illustrated in FIGS. 7 and 11. In FIG. 7, a calibration method for calibrating the control system 300 is shown. Although the following tasks are primary described with respect to the control system 300 being calibrated while being implemented and operated in the plasma processing system 10, the control system 300 may be calibrated (i) during manufacturing of the plasma processing system and/or a portion thereof, (ii) on a test stand, and/or (iii) in another plasma processing system 10. The control system 300 may be implemented in the plasma processing system 10 subsequent to calibration. Although the following operations are primarily described with respect to the implementations of FIGS. 1-6, the operations may be easily modified to apply to other implementations of the present disclosure. The operations may be iteratively performed.

The method may begin at 400. Although operations 402-407 are shown, tasks 402-406 or operation 407 may not be performed. Operations 402-407 are shown as examples operations for collecting variable capacitor position data. During operations 402-406, the match networks 17, 32 are operated based on a finite number of predetermined loads and for a finite number of recipes. The predetermined loads may (i) be test loads having impedances associated with recipes used during normal operation, or (ii) actual loads experienced under normal operating conditions. Although tasks 402-406 are described as being performed for match networks 17, 32 and the plasma processing system 10, the tasks 402-406 may also be performed for other match networks and plasma processing system of the same type as the match networks 17, 32 and the plasma processing system 10 and operating based on the same predetermined loads and recipes. The phrase "same type" refers to match networks manufactured with the same components and configured the same to provide similar results, such that one match network may be replace another match network of the same type.

At 402, the match networks 17, 32 are operated while experiencing a predetermined load and a predetermined recipe for the plasma processing system 10. The system controller 46 may initiate and control operation of the controllers 19, 34, which control operation of the match networks 17, 32. The load may be predetermined to provide stable consistent results of variable capacitor positions. A recipe may refer to a predetermined gas mixture, a predetermined concentration level, a predetermined power level, predetermined bias voltages, etc.

At 403, the controllers 19, 34 may determine whether predetermined requirements have been satisfied, such as whether: predetermined impedances of the match networks 17, 32, 152 and/or the power splitter 153 exist; a predetermined amount of power is being transferred through the match networks 17, 32, 152; and/or a predetermined power ratio exists between inner and outer coils (e.g., coils 100 and 102 of FIG. 2, coils 166 and 168 of FIG. 3, or coils L4 and L7 of FIG. 4). This determination may be based on signals from the sensors 44, 210 and/or other sensors included in the plasma processing system 10. If the predetermined requirements are not satisfied, operation 404 is performed, otherwise operation 405 is performed.

At 404, the controllers 19, 34 adjust the positions of the corresponding variable capacitors, as described above. The adjusted positions of the variable capacitors may be stored in the registers 114, 302. Operation 403 may be performed subsequent to operation 404. At 405, the position collection modules 310, 312 may access the registers 114, 302 and store the resultant positions of the variable capacitors in the memory 314.

At 406, the system controller 46 may determine whether to operate the match networks 17, 32 based on another load condition and/or for another recipe. Multiple load conditions may be provided for each recipe. If variable capacitor positions are to be obtained for another load condition and/or another recipe, operation 402 may be performed, otherwise operation 408 may be performed. Completion of operations 402-406 provides stored resultant capacitor position data for each load and each recipe.

At 407, historical variable capacitor position data is collected and stored in the memory 314. This may include the position collection modules 310, 312 collecting capacitor position data from the registers 114, 302 and/or from other registers of other match networks. The match networks may correspond to processing chambers other than the plasma processing chamber 12 and/or processing chambers of plasma processing systems other than the plasma processing system 10. The historical variable capacitor position data may be for any number of match networks, loads, recipes, and/or plasma processing chambers. The historical variable capacitor position data may be for multiple versions of the same type of match network connected to and/or supplying power to a same set of two or more loads. In one embodiment, operation 407 is performed subsequent to tasks 402-406.

The calibration process may include collecting position data for each variable capacitor of a RF match network and/or a power splitter of a TCCT match network and/or of a bias match network. The capacitor position data may be collected for one or more sets of match networks corresponding to one or more plasma processing chambers. A set of match networks may include, for example, the match networks of a particular plasma processing system and/or plasma processing chamber (e.g., the match networks 17 and 32 of the plasma processing system 10 and/or the plasma processing chamber 12). The capacitor position data may be collected for each load of multiple predetermined loads experienced for each of the plasma processing chambers. The capacitor position data may be collected and grouped based on the type of the match network and/or based on the corresponding plasma processing chamber of the match network.

At 408, the position conversion controller 54 may determine whether variable capacitor position data is only available for one set of match networks operating for one plasma processing chamber. When capacitor position data is only available for a single set of match networks operating for a single processing chamber, the set of match networks are operated based on different loads during operations 402-406. The resultant capacitor positions provided after being adjusted during operations 403-404 are stored at 405 and then used at 416. If data is only available for one set of match networks, operation 409 is performed, otherwise operation 410 is performed.

At 409, the conversion modules 316, 318 may set variable capacitor positions as reference capacitor positions to be used as a reference for operation 416. The conversion module 316 may perform operations for variable capacitors of the TCCT match network 17. The conversion module 318 may perform operations for variable capacitors of the bias match network 32. At 410, the modules 316, 318 may average capacitor positions of the same corresponding capacitors of different match networks of the same type, which correspond to different processing chambers operating based on a same load condition. For example, multiple RF match networks of different plasma processing chambers may include a version of the variable capacitor C1 of FIG. 4. The RF match networks may be operated based on the same load and recipe and adjusted accordingly. The resultant capacitor positions of the versions may be averaged to provide resultant average positions. This may be performed for each variable capacitor of the same type and implemented in the same type of match network. At 412, the conversion modules 316, 318 set (i) the average capacitor positions to reference capacitor positions, or (ii) capacitor positions associated with one of the match circuits and that are closest to the average capacitor positions as the reference capacitor positions. At 414, the modules 316, 318 store the reference capacitor positions in the memory 314.

At 416, the modules 316, 318 determine calibrated conversion parameters, mapping relationships and/or a conversion model for each of the variable capacitors of the match networks 17, 32. Calibrated conversion parameters may refer to unknowns of a conversion equation, unknown coefficients of a conversion polynomial equation, and/or other conversion parameters. Calibrated mapping relationships may refer to relationships between actual detected and/or commanded variable capacitor positions and the reference capacitor positions. Calibrated conversion models may include a conversion equation, a conversion polynomial equation, a linear equation, a conversion curve, a conversion table, etc. Three examples are provided by operations 416A, 416B, 416C.

At 416A, the conversion modules 316, 318, for each variable capacitor, determine unknowns of a position conversion equation. The position conversion equation may be a precise conversion from detected and/or commanded variable capacitor positions to reference capacitor positions based on parameters of the corresponding circuit. An example conversion equation is shown for a RF match network as equation 2, where: $s_2$ is a detected and/or commanded capacitor position; s is a reference capacitor position; $C_{02}$ is an actual capacitance of a capacitor of a branch of the RF match network; $C_0$ is capacitance corresponding to s; L2 is an inductance of a branch of the RF match network; L is an inductance corresponding to s; $\alpha_2$ is the capacitance per count ratio for the detected capacitor position $s_2$; $\alpha$ is the capacitance per count ratio for the reference capacitor position s; $\Delta L = L2 - L$; $f\{s_2\}$ is the function of $s_2$ to provide s as represented by equation 2, and $\omega$ is an angular frequency of a RF signal through the RF match network. The values of $C_0$, L and a may be unknown and determined during operation 416A. Alternatively, values of P1-P4 may be unknown values that are determined, where, P1 is P2 is $$\frac{C_0}{\alpha},$$

P2 is $\omega^2 \Delta L C_0$, P3 is $$\frac{C_{02}}{C_0},$$

and P4 is $$\frac{\alpha_2}{\alpha}.$$

$$s = f\{s_2\} = \frac{C_0}{\alpha}\left\{\frac{1}{\omega^2 \Delta L C_0 + \frac{1}{\frac{C_{02}}{C_0} + \frac{\alpha\alpha_2}{C_0\alpha}s_2}}\right\} = P1\left\{\frac{1}{P2 + \frac{1}{P3 + \frac{P4}{P1}s_2}} - 1\right\} \quad (2)$$

To determine the unknowns, values for $s_2$, s, L2, $C_{02}$ and $\alpha_2$ may be known for each of multiple loads, thus, providing at least a version of this equation for each unknown. Although equation 2 is shown, other conversion equations may be used. Equation 2 may be modified and/or replaced for different variable capacitors, match networks, etc. In one embodiment, equation 2 is not used.

To simplify the calibration process and/or determination of a conversion model, one or more of 416B and 416C may be performed. Operations 416B and 416C may be performed instead of operation 416A. Although the results of operations 416B and 416C may be less accurate than the results of operation 416A, the differences may be negligible, as shown below.

At 416B, the conversion modules 316, 318, for each variable capacitor, determines coefficients of a polynomial equation, such as a quartic equation, a quadratic equation, or a linear equation. Reference capacitor positions and corresponding detected variable capacitor positions are known. If a quartic equation, such as equation 3 is used, coefficients $a_0$-$a_4$ are determined, where $g(s_2)$ is a golden match conversion function used to provide comparable capacitor (or golden match) positions in the method of FIG. 11. At least five pairs of capacitor position data are used to provide at least five equations and five unknowns. As an example, five different data pairs of $\{s_{2i}, s_i\}$ with one pair for each of 5 loads of a single plasma processing chamber or one pair for each plasma processing chamber operating with a same load may be used, where i refers to the number of the data pair.

$$s = g(s_2) = a_4 s_2^4 + a_3 s_2^3 + a_2 s_2^2 + a_1 s_2 + a_0 \quad (3)$$

Figure 8B:
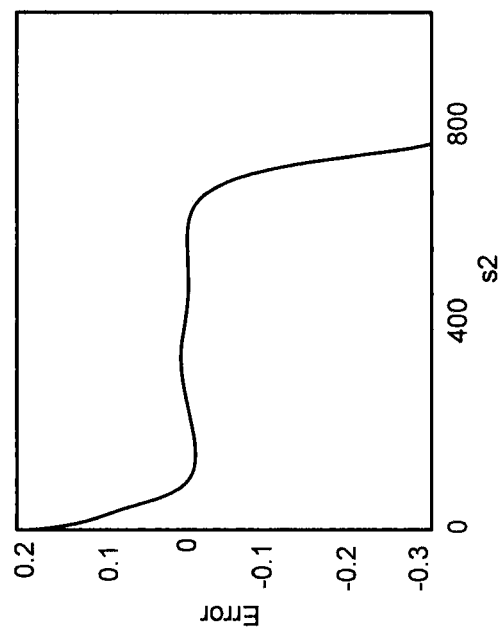
FIG. 8B is an example plot of error between the comparable capacitor position curve and the quartic polynomial conversion curve of FIG. 8A.
Figure 8A:
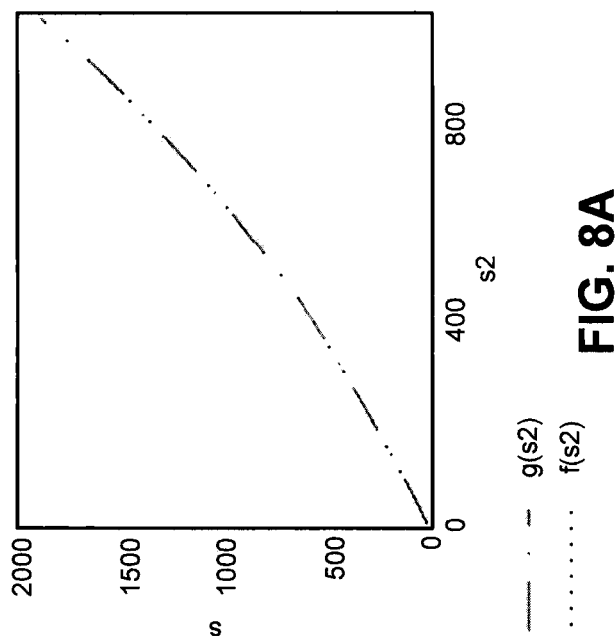
FIG. 8A is an example plot of a comparable capacitor position curve and a quartic polynomial conversion curve for detected capacitor positions in accordance with an embodiment of the present disclosure.

FIG. 8A shows an example plot of $f\{s_2\}$ and $g(s_2)$ for detected capacitor positions $s_2$. FIG. 8B shows an example plot of error between the curves of $g(s_2)$ and $f\{s_2\}$ for the quartic polynomial conversion. As shown, the plot of FIG. 8B is for $g(s_2) - f\{s_2\}$. The quartic polynomial closely matches a curve represented by equation 2. This can be seen by the plot of FIG. 8A. As can be seen the error is negligible. The range of $s_2$ may be different than the range of s. As an example, the range of s may be 0-650 counts, where the range of $s_2$ may be 0-1000 counts.

Figure 9B:
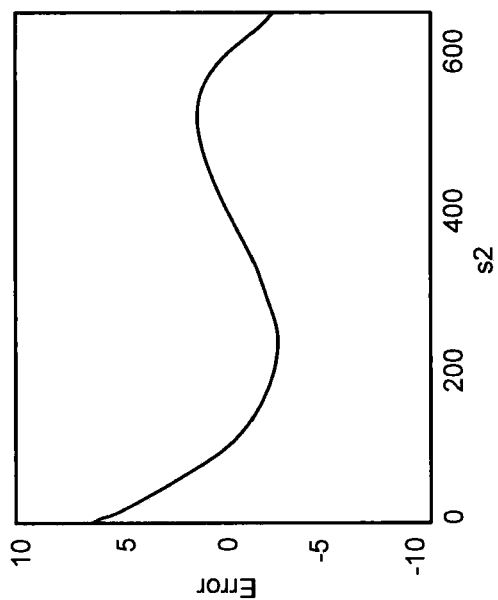
FIG. 9B is an example plot of error between the comparable capacitor position curve and the quadratic polynomial conversion curve of FIG. 9A.
Figure 9A:
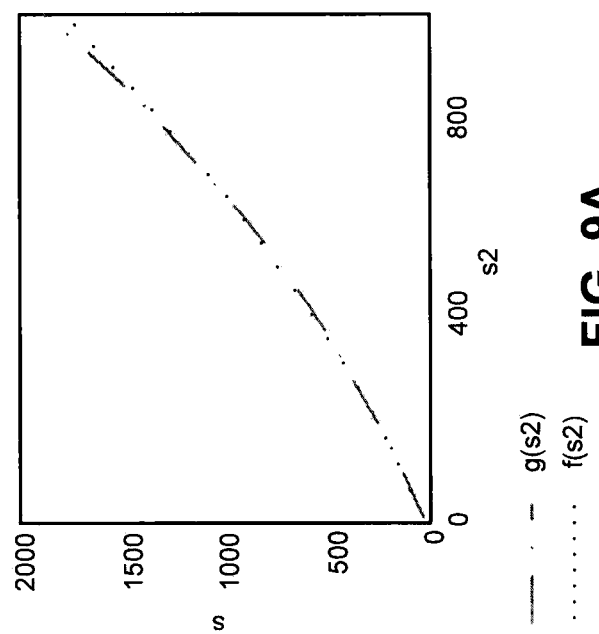
FIG. 9A is an example plot of a comparable capacitor position curve and a quadratic polynomial conversion curve for detected capacitor positions in accordance with an embodiment of the present disclosure.
Figure 10B:
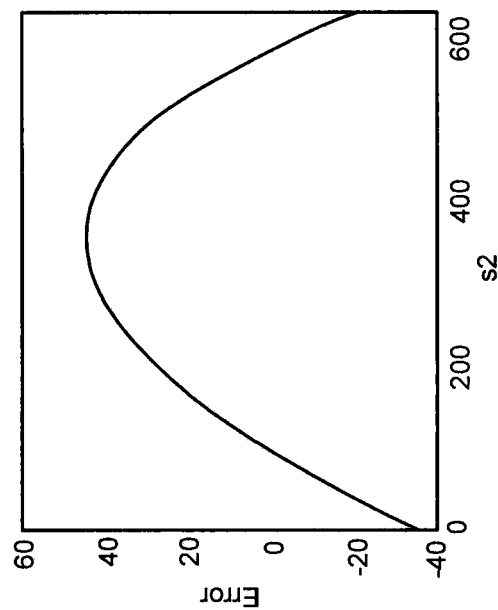
FIG. 10B is an example plot of error between the comparable capacitor position curve and the linear conversion curve of FIG. 10A.
Figure 10A:
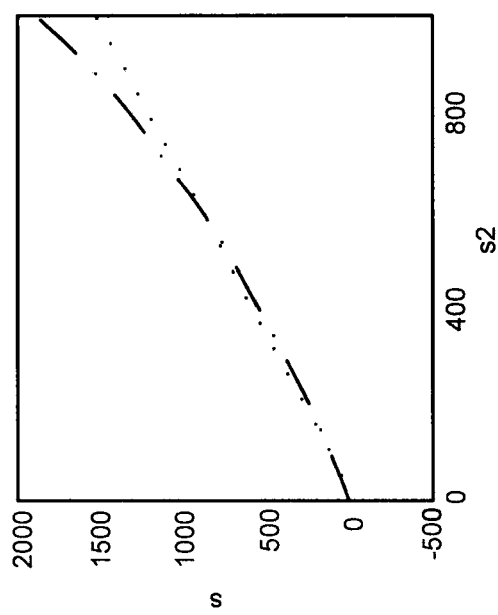
FIG. 10A is an example plot of a comparable capacitor position curve and a linear conversion curve for detected capacitor positions in accordance with an embodiment of the present disclosure.

A lower order polynomial equation may be used instead of the quartic polynomial. The number of pairs of capacitor position data is at least equal to the order of the polynomial equation. The lower the order of the polynomial, the higher the error between $f\{s_2\}$ and $g(s_2)$. As a first example, a quadratic polynomial may be used. Example results are shown in FIGS. 9A and 9B. FIG. 9A shows an example plot of $f\{s_2\}$ and $g(s_2)$ for detected capacitor positions, where $g(s_2)$ is represented by a quadratic polynomial curve. FIG. 9B shows an example plot of error between the curves of $f\{s_2\}$ and $g(s_2)$ for the quadratic polynomial conversion example. As another example, a linear equation may be used. Slope and intercept information corresponding to the linear equation may be stored in the memory 314. Example results are shown in FIGS. 10A and 10B. FIG. 10A shows an example plot of $f\{s_2\}$ and $g(s_2)$, where $g(s_2)$ is represented by a line. FIG. 10B shows an example plot of error between the curves of $f\{s_2\}$ and $g(s_2)$ for the linear conversion example.

At 416C, the conversion modules 316, 318, for each variable capacitor, may plot and/or determine a set of points, wherein each set of points refers to a data pair including one of the reference capacitor positions and a corresponding one of the actual capacitor positions. As an example, reference capacitor positions for one or more match networks of the same type, one or more loads, and/or one or more plasma processing chambers may be plotted relative to corresponding actual capacitor positions. As another example, average capacitor positions for different loads experienced in a same processing chamber and/or the average capacitor positions for different loads of different processing chambers may be plotted relative to the actual capacitor positions. A curve fitting process may then be performed to generate a curve that is curve fit to the set of points. In one embodiment, a least squares fit to a polynomial curve is used. The set of points may be curve fit using a polynomial curve, such as a quartic curve, a quadratic curve, a linear curve, another polynomial-based curve, and/or a combination these curves. For example, a linear curve may be used for a first portion of positions and a higher order polynomial curve may be used for a second portion of the positions. In another embodiment, a lower order polynomial equation is used for a limited number of positions. For example, a linear curve or a quadratic curve may be used for positions associated with 0-650 counts.

The resultant calibrated conversion parameters, mapping relationships, equations, curves, and/or conversion models determined during operation 416 may be stored in the memory 314 at 418 and used to convert actual capacitor positions to comparable capacitor positions during operation of a corresponding plasma processing system. This is further described with respect to the method of FIG. 11. The data pairs of $s_{2i}$, $s_i$ collected and/or provided during the above-stated method may be stored in the registers 114, 302, where i is an integer greater than or equal to 2. One data pair may be stored for each variable capacitor. In one embodiment, only the $s_{2i}$ values are stored in the registers 114, 302 and later provided to the position conversion controller 54. The method may end at 420.

The above-describe method may be periodically repeated to account for shifts over time. This allows for calibrated data to be adjusted and mapping relationships and calibrated conversion models to be updated.

The above-described operations are meant to be illustrative examples; the operations may be performed sequentially, synchronously, simultaneously, continuously, during overlapping time periods or in a different order depending upon the application. Also, any of the operations may not be performed or skipped depending on the implementation and/or sequence of events.

In FIG. 11, a method of operating the control system 300 and the plasma processing system 10 based on results of the calibration method of FIG. 7 is shown. Although the following operations are primarily described with respect to the implementations of FIGS. 1-6, the operations may be easily modified to apply to other implementations of the present disclosure. The operations may be iteratively performed.

The method may begin at 500. At 502, the plasma processing system 10 is run including operating the match networks 17, 32 according to a predetermined recipe. At 504, positions of the variable capacitors of the match networks 17, 32 are adjusted to satisfy predetermined requirements. The predetermined requirements may include: predetermined impedances of the match networks 17, 32, 152 and/or the power splitter 153; a predetermined amount of power transfer through the match networks 17, 32, 152; a predetermined power ratio between inner and outer coils (e.g., coils 100 and 102 of FIG. 2, coils 166 and 168 of FIG. 3, or coils L4 and L7 of FIG. 4); and/or other predetermined requirements.

At 506, the position collection modules 310, 312 may collect variable capacitor position data from the registers 114, 302. This may include collecting the data pairs $s_{2i}$, $s_i$. In an embodiment, the position collection modules 310, 312 monitor match networks based on serial numbers of the match networks and access data pairs stored in the registers 114, 302 each time digital communication via an interface (e.g., a RS-232 interface, an Ethernet interface, an Ethernet for control automation technology (EtherCat) interface, or other suitable interface) with the controllers 19, 34 is established. At 508, the conversion modules 316, 318 convert actual detected and/or commanded variable capacitor positions to comparable capacitor (or golden match) positions. The conversions are performed based on the calibrated conversion parameters, mapping relationships, equations, curves, and/or conversion models determined during operation 416. As an example, an actual capacitor position may be plugged into a conversion equation to provide the comparable capacitor position. As another example, a conversion plot, curve, table, and/or other mapping relationship may be used to convert the actual capacitor positions.

At 510, the modules 316, 318 store the comparable capacitor positions in the memory 314 and/or display the comparable capacitor positions for data logging purposes on the display 50. The comparable capacitor positions displayed on the display 50 are not actual positions of the corresponding variable capacitors. By displaying the comparable capacitor positions, false alarms are prevented. The comparable capacitor positions should be similar to comparable capacitor positions of other match networks of the same type regardless of manufacturing differences, as a result of the above-described calibration and conversion processes. This prevents a system operator from being alerted of large differences in variable capacitor positions due simply to manufacturing differences.

In one embodiment, the following operations 512-516 are not performed. At 512, the comparison module 322 may compare the comparable capacitor positions for two or more match networks of the same type and/or two or more plasma processing chambers. This data may be collected from the memory 314 of the system controller 46 and/or other memories of other system controllers corresponding to any number of plasma processing chambers. This may be done to detect an outlier match network and/or power splitter that is operating different than other match networks and/or power splitters of the same type and recipe conditions. At 514, the degradation reporting module 324 evaluates results of the comparisons performed at 512. This may include comparing differences to predetermined values and determining whether the differences exceed the predetermined values and/or outside predetermined ranges of the predetermined values. For example, if a difference is greater than or equal to 10 counts (or 1.0% of a full operating range), then an issue may be reported.

At 516, the degradation reporting module may display detected issues with the match networks 17, 32, the differences resulting from the comparisons, values indicating how close the differences are to the predetermined thresholds and/or predetermined ranges, etc. The degradation reporting module may perform a countermeasure when: an issue with one of the match networks 17, 32 exists; one or more of the differences exceeds the corresponding predetermined threshold(s); and/or one or more of the differences is outside the corresponding predetermined range(s). The countermeasure may include: deactivating power and/or limiting power to one or more of the match networks 17, 32; deactivating portions or all of the plasma processing system 10, or other suitable countermeasure. The countermeasure may include performing an action based on an input received from a system operator in response to the reported information displayed on the display 50. The method may end at 518.

The above-described operations are meant to be illustrative examples; the operations may be performed sequentially, synchronously, simultaneously, continuously, during overlapping time periods or in a different order depending upon the application. Also, any of the operations may not be performed or skipped depending on the implementation and/or sequence of events.

In one embodiment, preset values for the variable capacitors of one or more match networks are provided. The present values may be predetermined and/or provided via the input device 52 of FIG. 1. The present values may be accessed from the memory 314. The position conversion controller 54 performs a reverse conversion from that described above and translates s values to $s_2$ values. Variable capacitor positions are then adjusted to match the $s_2$ values, which are the values sent to the controllers 19, 34. As an example, a reverse version of equation 2 may be used for this process.

The above-described methods provide improved mapping of variable capacitor positions to reference match positions using, for example, polynomial based conversions. The methods provide a range of adjustment and allow for calibration data to be adjusted to account for shifts over time.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A control system comprising:
a memory configured to store position data of first positions of a first variable capacitor of a first match network of a first plasma processing system, and wherein each of the first positions of the first variable capacitor corresponds to a respective one of a plurality of loads experienced by the first match network; and
a position conversion controller configured to
obtain the position data stored in the memory,
determine reference capacitor positions based on the position data,
determine a calibrated conversion model based on the reference capacitor positions, wherein the calibrated conversion model converts second positions of the first variable capacitor to comparable capacitor positions, and wherein the second positions are positions of the first variable capacitor existing subsequent to the determination of the calibrated conversion model,
store the calibrated conversion model,
compare the comparable capacitor positions to comparable capacitor positions of other match networks,
based the comparisons, determine whether the first match network is an outlier relative to the other match networks, and
if the first match network is an outlier, perform a countermeasure to change operation of the first plasma processing system.

2. The control system of claim 1, further comprising:
a match network controller of the first match network, wherein the match network controller comprises a register, and wherein the register is configured to store the position data; and
a position collection module separate from the match network controller and configured to (i) obtain the position data stored in the register of the match network controller, and (ii) store the position data in the memory.

3. The control system of claim 1, wherein the comparable capacitor positions are comparable to third positions of a second variable capacitor of a second match network, such that effects of manufacturing differences between the first match network and the second match network on differences between the second positions and the third positions are minimized.

4. The system of claim 3, wherein:
the comparable capacitor positions are comparable to the third positions of the second match network, such that effects of manufacturing differences between the first plasma processing system and a second plasma processing system on differences between the second positions and the third positions are minimized;
the second match network is a same type of match network as the first match network; and
the second match network is operated for the second plasma processing system.

5. The system of claim 3, wherein the third positions are comparable capacitor positions determined using a second calibrated conversion model.

6. The system of claim 1, wherein the calibrated conversion model includes conversion parameters, a mapping relationship, and a conversion equation.

7. The system of claim 6, wherein the conversion equation is a polynomial equation.

8. The system of claim 6, wherein the conversion equation is a quartic polynomial equation.

9. The system of claim 1, further comprising a position collection module configured to (i) obtain the position data from a register of a first match network controller, (ii) store the position data in the memory, and (iii) collect position data from the register of a second match network controller of a second match network,
wherein the position conversion controller is configured to determine the reference capacitor positions based on the position data received from the register of the second match network controller.

10. The system of claim 1, further comprising a position collection module configured to collect position data from registers of a plurality of controllers controlling operation of a plurality of match networks, wherein the plurality of match networks include the first match network and correspond to at least one plasma processing chamber; and
wherein the position conversion controller is configured to determine the reference capacitor positions based on the position data received from the registers of the plurality of controllers.

11. The system of claim 1, wherein the reference capacitor positions are results of the position conversion controller adjusting the second positions to satisfy predetermined operating requirements of the first plasma processing system to generate the calibrated conversion model.

12. The system of claim 1, further comprising a match network controller of the first match network, wherein the match network controller comprises a register, wherein:
the register is configured to store the position data;
the match network controller is configured to control adjustment of a position of the first variable capacitor while the first plasma processing system is operating according to a first recipe and while the first match network is providing power to a first load;
the match network controller is configured to, prior to the position conversion controller accessing the position data from the register of the match network controller, adjust the position of the first variable capacitor to satisfy at least one predetermined requirement; and
the predetermined requirement includes at least one of (i) a predetermined impedance of the first match network, (ii) a predetermined amount of power transferred through the first match network, or (iii) a predetermined power ratio between an inner coil and an outer coil of a transformer coupled capacitive tuning network.

13. The control system of claim 1, wherein:
each of the reference capacitor positions is based on one of the first positions of the first variable capacitor and a position of a second variable capacitor;

the second variable capacitor is implemented in a second match network; and the second match network is a same type of match network as the first match network.

14. The control system of claim 13, wherein the second match network is implemented in a different processing chamber than the first match network.

15. The control system of claim 13, wherein:
the positions of the second variable capacitor are actual positions of the second variable capacitor;
the second positions of the first variable capacitor are not directly comparable to the actual positions of the second variable capacitor due to manufacturing differences; and
the comparable capacitor positions of the first variable capacitor are directly comparable to comparable capacitor positions of the second variable capacitor, wherein the comparable capacitor positions of the second variable capacitor are converted from the actual positions of the second variable capacitor.

16. The control system of claim 1, wherein each of the reference capacitor positions is based on one of the first positions of the first variable capacitor and positions of variable capacitors of a plurality of match networks other than the first match network.

17. The control system of claim 16, wherein each of the first match network and the plurality of match networks are implemented in a respective processing chamber.

18. The control system of claim 1, wherein:
the comparable capacitor positions are first comparable capacitor positions;
the first comparable capacitor positions are comparable to second comparable capacitor positions of capacitors of other match networks; and
the calibrated conversion model converts actual variable capacitor positions of the other match networks to resultant values that are able to be directly compared to values of the first comparable capacitor positions.

19. The control system of claim 18, wherein the position conversion controller is configured to:
compare the first comparable capacitor positions to the second comparable capacitor positions,
based on the comparisons, determine if the first match network is an outlier relative to the other match networks, and
if the first match network is an outlier, perform the countermeasure.

20. The control system of claim 1, wherein the comparable capacitor positions are not actual positions of the first variable capacitor.

21. The control system of claim 1, wherein the countermeasure includes reducing power to one or more components of the first plasma processing system.

22. The control system of claim 1, wherein the countermeasure includes at least one of deactivating or limiting power to the first match network or deactivating a portion of the plasma processing system.

23. A control system comprising:
a memory configured to store position data of first positions of a variable capacitor of a first power splitter of a first plasma processing system, and wherein each of the first positions of the variable capacitor corresponds to a respective one of a plurality of loads experienced by the first power splitter; and
a position conversion controller configured to
obtain the position data stored in the memory,
determine reference capacitor positions based on the position data,
determine a calibrated conversion model based on the reference capacitor positions, wherein the calibrated conversion model converts second positions of the variable capacitor to comparable capacitor positions, and wherein the second positions are positions of the variable capacitor existing subsequent to the determination of the calibrated conversion model,
store the calibrated conversion model,
compare the comparable capacitor positions to comparable capacitor positions of another power splitter,
based the comparisons, determine whether an issue exists with the first power splitter, and
if an issue exists with the first power splitter, perform a countermeasure to change operation of the first plasma processing system.

24. The control system of claim 23, wherein the comparable capacitor positions are comparable to third positions of a variable capacitor of a second power splitter, such that effects of manufacturing differences between the first power splitter and the second power splitter on differences between the second positions and the third positions are minimized.

25. The system of claim 23, wherein:
the calibrated conversion model includes conversion parameters, a mapping relationship, and a conversion equation; and
the conversion equation is a quartic polynomial equation.

26. A system comprising:
a first controller configured to control operation of a plasma processing system; and
a memory configured to store position data of a first variable capacitor of a first match network of the plasma processing system,
wherein the first controller comprises
a conversion module configured to (i) obtain the position data of the first variable capacitor stored in the memory, wherein the position data includes first positions of the first variable capacitor for a respective plurality of loads on the first match network, and (ii) convert the first positions to comparable capacitor positions based on a calibrated conversion model, wherein the calibrated conversion model is based on reference capacitor positions of the first variable capacitor,
a display module configured to display the comparable capacitor positions on a display,
a comparison module configured to compare the comparable capacitor positions to comparable capacitor positions of another match network, and
a degradation reporting module configured to, based the comparisons, determine whether an issue exists with the first match network, and if an issue exists with the first match network, perform a countermeasure to change operation of the plasma processing system.

27. The system of claim 26, further comprising a second controller configured to:
control adjustment of a position of the first variable capacitor while the plasma processing system is operating according to a first recipe and while the first match network is providing power to a first load;
adjust the position of the first variable capacitor to satisfy at least one predetermined requirement; and
store a resultant position of the first variable capacitor in a register when the at least one predetermined requirement is satisfied, wherein
- the plurality of loads include the first load, and
- the first controller is configured to access the register to obtain the resultant position of the first variable capacitor, and
- the first positions include the resultant position.

28. The system of claim 27, wherein:
- the first recipe is different than a second recipe; and
- the second recipe is used during calibration to generate the calibrated conversion model.

29. The system of claim 27, wherein the predetermined requirement includes at least one of (i) a predetermined impedance of the first match network, (ii) a predetermined amount of power transferred through the first match network, or (iii) a predetermined power ratio between an inner coil and an outer coil of a transformer coupled capacitive tuning network.

30. The system of claim 26, wherein the calibrated conversion model includes conversion parameters, a mapping relationship, and a conversion equation.

31. The system of claim 30, wherein the conversion equation is a polynomial equation.

32. The system of claim 30, wherein the conversion equation is a quartic polynomial equation.

33. The system of claim 26, wherein:
- the comparison module is configured to compare the first positions to second positions, wherein the second positions are positions of a second variable capacitor of a second match network, wherein the second match network is a same type of match network as the first match network; and
- the degradation reporting module is configured to (i) evaluate results of the comparisons, and (ii) based on the results, indicate whether an issue exists with the first match network.

* * * * *